United States Patent
Kamiga et al.

(10) Patent No.: US 10,580,910 B2
(45) Date of Patent: Mar. 3, 2020

(54) SILVER-COATED COPPER POWDER AND METHOD FOR PRODUCING SAME

(71) Applicant: DOWA ELECTRONICS MATERIALS CO., LTD., Tokyo (JP)

(72) Inventors: Hiroshi Kamiga, Tokyo (JP); Noriaki Nogami, Tokyo (JP); Aiko Hirata, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 16/071,578

(22) PCT Filed: Jan. 26, 2017

(86) PCT No.: PCT/JP2017/002676
§ 371 (c)(1),
(2) Date: Jul. 20, 2018

(87) PCT Pub. No.: WO2017/135138
PCT Pub. Date: Aug. 10, 2017

(65) Prior Publication Data
US 2019/0027620 A1    Jan. 24, 2019

(30) Foreign Application Priority Data

Feb. 3, 2016 (JP) .................................. 2016-018674
Nov. 22, 2016 (JP) .................................. 2016-227021

(51) Int. Cl.
*H01L 31/0224* (2006.01)
*B22F 1/02* (2006.01)
(Continued)

(52) U.S. Cl.
CPC .... *H01L 31/022425* (2013.01); *B22F 1/0011* (2013.01); *B22F 1/025* (2013.01);
(Continued)

(58) Field of Classification Search
CPC ....... B22F 1/0011; C22C 1/0245; H01B 1/22; H01B 13/00
See application file for complete search history.

(56) References Cited

U.S. PATENT DOCUMENTS 3,202,488 A * 8/1965 Avery ..................... B22F 1/025
252/514
4,552,690 A * 11/1985 Ikeguchi .................. C08K 3/08
252/500

(Continued)

FOREIGN PATENT DOCUMENTS

JP     0762274 A     3/1995
JP  2002157918 A     5/2002

(Continued)

OTHER PUBLICATIONS

Peng et Al., "Study on synthesis of ultrafine Cu—Ag core-shell powders with high electrical conductivity", Elsevier, Applied Surface Science, vol. 263, 2012, pp. 38-44 (Year: 2012).*

(Continued)

*Primary Examiner* — William Coleman
(74) *Attorney, Agent, or Firm* — Bachman & LaPointe, PC

(57) ABSTRACT

There is provided a silver-coated copper powder which can improve the conversion efficiency of a solar cell in comparison with conventional silver-coated copper powders when it is used in an electrically conductive paste used for forming the busbar electrodes of the solar cell, the silver-coated copper powder being capable of producing a solar cell having a high conversion efficiency which is the same degree as that of a solar cell using silver powder, and a method for producing the same. A silver-coated copper powder obtained by coating the surface of a copper powder, which is obtained by the atomizing method or the like, with 5 wt % or more (with respect to the silver-coated copper (Continued)

powder) of a silver containing layer of silver or a silver compound, is added to a cyanide solution, such as a potassium silver cyanide solution, a potassium gold cyanide solution, a potassium cyanide solution or a sodium cyanide solution, to cause the copper powder coated with the silver containing layer to contain 3 to 3000 ppm of cyanogen.

28 Claims, 1 Drawing Sheet

(51) Int. Cl.
  *H01B 1/22*  (2006.01)
  *C22C 1/04*  (2006.01)
  *C22C 9/00*  (2006.01)
  *B22F 1/00*  (2006.01)
  *C22C 5/06*  (2006.01)

(52) U.S. Cl.
  CPC .............. *C22C 1/0425* (2013.01); *C22C 5/06* (2013.01); *C22C 9/00* (2013.01); *H01B 1/22* (2013.01); *B22F 2301/10* (2013.01); *B22F 2301/255* (2013.01); *B22F 2304/10* (2013.01); *B22F 2999/00* (2013.01)

(56) References Cited

U.S. PATENT DOCUMENTS

| | | | |
|---|---|---|---|
| 5,587,111 A * | 12/1996 | Watanabe | B22F 1/0018 252/513 |
| 10,077,502 B2 * | 9/2018 | Shinohara | H01H 1/025 |
| 2008/0280372 A1 * | 11/2008 | Walker | G01N 21/78 436/109 |
| 2016/0040271 A1 * | 2/2016 | Ogi | H05K 1/092 252/514 |
| 2017/0232510 A1 * | 8/2017 | Nogami | C09D 11/037 427/74 |
| 2018/0272425 A1 * | 9/2018 | Nogami | B22F 1/025 |

FOREIGN PATENT DOCUMENTS

| | | |
|---|---|---|
| JP | 2007073545 A | 3/2007 |
| JP | 2010077495 A | 4/2010 |
| JP | 2010174311 A | 8/2010 |
| JP | 2016130365 A | 7/2016 |

OTHER PUBLICATIONS

International search report for patent application No. PCT/JP2017/002676 dated Mar. 17, 2017.

* cited by examiner

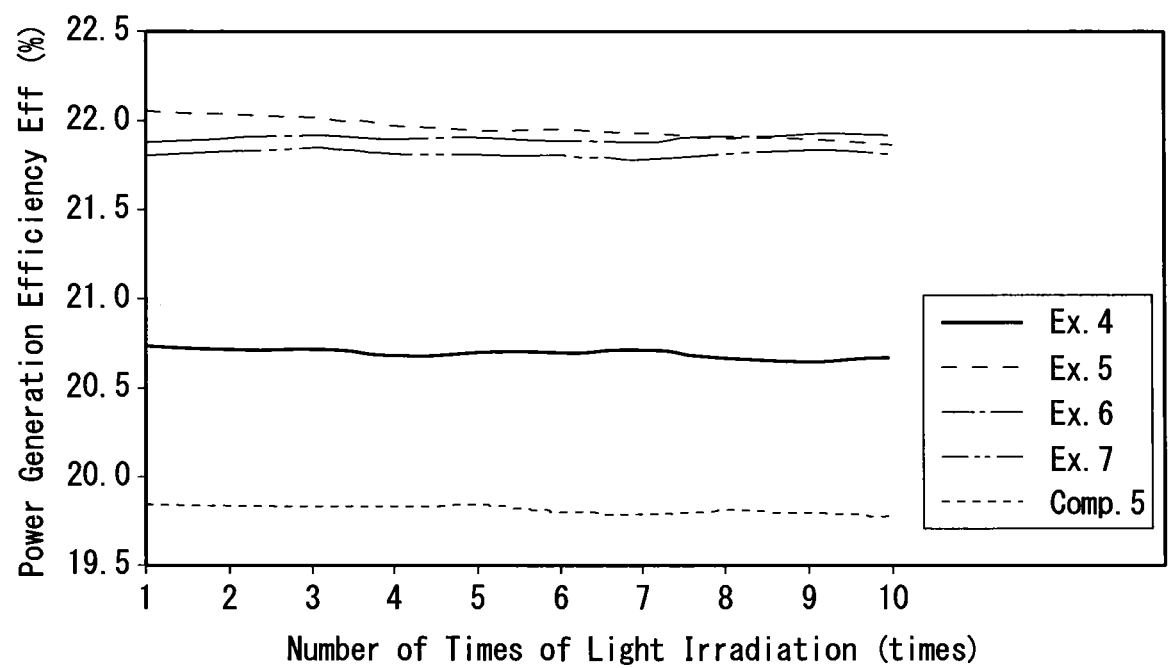

SILVER-COATED COPPER POWDER AND METHOD FOR PRODUCING SAME

TECHNICAL FIELD

The present invention relates generally to a silver-coated copper powder and a method for producing the same. More specifically, the invention relates to a silver-coated copper powder for use in electrically conductive pastes and so forth, and a method for producing the same.

BACKGROUND ART

Conventionally, an electrically conductive paste prepared by mixing or compounding a solvent, a resin, a dispersant and so forth with an electrically conductive metal powder, such as silver or copper powder, is used for forming electrodes and electric wires of electronic parts by a printing method or the like.

However, silver powder increases the costs of the paste since it is a noble metal although it is a good electrically conductive material having a very low volume resistivity. On the other hand, the storage stability (reliability) of copper powder is inferior to that of silver powder since copper powder is easily oxidized although it is a good electrically conductive material having a low volume resistivity.

In order to solve these problems, as metal powders for use in electrically conductive pastes, there is proposed a silver-coated copper powder wherein the surface of copper powder is coated with silver (see, e.g., Patent Documents 1-2).

PRIOR ART DOCUMENT(S)

Patent Document(s)

Patent Document 1: Japanese Patent Laid-Open No. 2010-174311 (Paragraph Number 0003)
Patent Document 2: Japanese Patent Laid-Open No. 2010-077495 (Paragraph Number 0006)

SUMMARY OF THE INVENTION

Problem to be Solved by the Invention

In recent years, as an electrically conductive paste used for forming the busbar electrodes of a solar cell, it is attempted to use an electrically conductive paste using a silver-coated copper powder, which is cheaper than silver powder, in place of an electrically conductive paste using silver powder.

However, if an electrically conductive paste using a conventional silver-coated copper powder, such as silver-coated copper powders of Patent Documents 1-2, is used for forming the busbar electrodes of a solar cell, there is a problem in that the conversion efficiency of the solar cell is lower than that in case of the electrically conductive paste using silver powder.

It is therefore an object of the present invention to eliminate the aforementioned conventional problems and to provide a silver-coated copper powder which can improve the conversion efficiency of a solar cell in comparison with conventional silver-coated copper powders when it is used in an electrically conductive paste used for forming the busbar electrodes of the solar cell, the silver-coated copper powder being capable of producing a solar cell having a high conversion efficiency which is the same degree as that of a solar cell using silver powder, and a method for producing the same.

Means for Solving the Problem

In order to accomplish the aforementioned object, the inventors have diligently studied and found that it is possible to produce a silver-coated copper powder which can improve the conversion efficiency of a solar cell in comparison with conventional silver-coated copper powders when it is used in an electrically conductive paste used for forming the busbar electrodes of the solar cell, the silver-coated copper powder being capable of producing a solar cell having a high conversion efficiency which is the same degree as that of a solar cell using silver powder, if a copper powder, the surface of which is coated with a silver containing layer, is added to a cyanide solution to cause the copper powder coated with the silver containing layer to contain cyanogen. Thus, the inventors have made the present invention.

According to the present invention, there is provided a method for producing a silver-coated copper powder, the method comprising the steps of: preparing a copper powder, the surface of which is coated with a silver containing layer; and adding the copper powder to a cyanide solution to cause the copper powder coated with the silver containing layer to contain 3 to 3000 ppm of cyanogen. In this method for producing a silver-coated copper powder, the silver containing layer is preferably a layer of silver or a silver compound. The silver containing layer is more preferably a layer of silver. In this case, the content of cyanogen in the silver-coated copper powder is preferably in the range of from 3 ppm to 10 ppm. The amount of the silver containing layer with respect to the silver-coated copper powder is preferably 5% by weight or more. The copper powder coated with the silver containing layer preferably contains no cyanogen before the copper powder coated with the silver containing layer is added to the cyanide solution. The cyanide solution is preferably a potassium silver cyanide solution, a potassium gold cyanide solution, a potassium cyanide solution or a sodium cyanide solution. The particle diameter ($D_{50}$ diameter) corresponding to 50% of accumulation in cumulative distribution of the copper powder, which is measured by a laser diffraction particle size analyzer, is preferably in the range of from 0.1 μm to 15 μm. Moreover, phytic acid or an azole serving as a surface treating agent may be caused to adhere to the surface of the copper powder coated with the silver containing layer, after the copper powder coated with the silver containing layer is caused to contain cyanogen.

According to the present invention, there is provided a silver-coated copper powder comprising: a silver coating layer; and a copper powder, the surface of which is coated with the silver containing powder, wherein the amount of cyanogen in the silver-coated copper powder is in the range of from 3 ppm to 3000 ppm. In this silver-coated copper powder, the silver containing layer is preferably a layer of silver or a silver compound. The silver containing layer is more preferably a layer of silver. In this case, the content of cyanogen in the silver-coated copper powder is preferably in the range of from 3 ppm to 10 ppm. The amount of the silver containing layer with respect to the silver-coated copper powder is preferably 5% by weight or more. The particle diameter ($D_{50}$ diameter) corresponding to 50% of accumulation in cumulative distribution of the copper powder, which is measured by a laser diffraction particle size analyzer, is preferably in the range of from 0.1 μm to 15 μm. The content of each of carbon and nitrogen in the silver-coated copper powder is preferably 0.04% by weight or more. Moreover, as a surface treating agent, phytic acid or an azole may adhere to the surface of the copper powder coated with the silver containing layer.

According to the present invention, there is provided an electrically conductive paste wherein the above-described silver-coated copper powder is used as an electric conductor. Alternatively, there is provided an electrically conductive paste comprising: a solvent; a resin; and the above-described silver-coated copper powder as an electrically conductive powder.

According to the present invention, there is provided a method for producing an electrode for solar cell, the method comprising the steps of: applying the above-described electrically conductive paste on a substrate; and curing the electrically conductive paste to form an electrode on the surface of the substrate.

Effects of the Invention

According to the present invention, it is possible to produce a silver-coated copper powder which can improve the conversion efficiency of a solar cell in comparison with conventional silver-coated copper powders when it is used in an electrically conductive paste used for forming the busbar electrodes of the solar cell, the silver-coated copper powder being capable of producing a solar cell having a high conversion efficiency which is the same degree as that of a solar cell using silver powder.

BRIEF DESCRIPTION OF THE DRAWINGS

FIG. 1 is a graph showing the relationship between the power generation efficiency Eff of a solar cell and the number of times of light irradiation to the solar cell produced in each of Examples 4-7 and Comparative Example 5.

MODE FOR CARRYING OUT THE INVENTION

In the preferred embodiment of a method for producing a silver-coated copper powder according to the present invention, a copper powder, the surface of which is coated with a silver containing layer, is added to a cyanide solution to cause the copper powder coated with the silver containing layer to contain 3 to 3000 ppm (preferably 3 to 1000 ppm, more preferably 3 to 100 ppm, more preferably 3 to 10 ppm and most preferably 4 to 9 ppm) of cyanogen (CN).

The silver containing layer is preferably a layer of silver or a silver compound, and more preferably a layer (silver layer) of 90% by weight or more of silver. The coating amount of the silver containing layer with respect to the silver-coated copper powder is preferably not less than 5% by weight, more preferably in the range of from 7% by weight to 50% by weight, more preferably in the range of from 8% by weight to 40% by weight, and most preferably in the range of from 9% by weight to 20% by weight. If the coating amount of the silver containing layer is less than 5% by weight, it is not preferable since there is a bad influence on the electrical conductivity of the silver-coated copper powder. On the other hand, if the coating amount of the silver containing layer exceeds 50% by weight, it is not preferable since the costs are enhanced by the increase of the amount of silver to be used.

The cyanide solution is preferably a solution which can cause the copper powder coated with the silver containing layer to contain cyanogen (or which can cause the surface of the copper powder coated with the silver containing layer to adsorb cyanogen) and which does not dissolve the silver containing layer therein. As such a cyanide solution, there can be used a potassium gold cyanide solution, a potassium silver cyanide solution, a potassium cyanide solution, a sodium cyanide solution or the like. If a potassium gold cyanide solution or a potassium silver cyanide solution is used as the cyanide solution, it is possible to cause gold or silver to be supported on the exposed portion of the copper powder of the silver-coated copper powder, the exposed portion being not coated with the silver containing layer.

After the copper powder coated with the silver containing layer (the silver-coated copper powder) is caused to contain cyanogen, a surface treating agent is preferably caused to adhere to the surface of the silver-coated copper powder. As this surface treating agent, there is preferably used phytic acid, or an azole such as benzotriazole.

In order to cause the surface treating agent to adhere to the surface of the silver-coated copper powder, an aqueous or alcohol solution of the surface treating agent is preferably added to a slurry of the silver-coated copper powder while the slurry is stirred. The adhering amount of the surface treating agent with respect to the silver-coated copper powder is preferably 0.01 to 1.5% by weight and more preferably 0.05 to 1.0% by weight.

With respect to the particle diameter of the copper powder, the particle diameter ($D_{50}$ diameter) corresponding to 50% of accumulation in cumulative distribution of the copper powder, which is measured by a laser diffraction particle size analyzer (by helos method), is preferably in the range of from 0.1 μm to 15 μm, more preferably in the range of from 0.3 μm to 10 μm, and most preferably in the range of from 1 μm to 5 μm. If the particle diameter ($D_{50}$ diameter) is less than 0.1 μm, it is not preferable since there is a bad influence on the electrical conductivity of the silver-coated copper powder. On the other hand, if the particle diameter ($D_{50}$ diameter) exceeds 15 μm, it is not preferable since it is difficult to form fine wires.

Although the copper powder may be produced by a wet reducing method, an electrolytic method, a gas phase method or the like, it is preferably produced by a so-called atomizing method (such as a gas atomizing method or a water atomizing method) for producing a fine powder by rapidly cooling and solidifying copper, which is melted at a temperature of not lower than the melting temperature thereof, by causing a high-pressure gas or high-pressure water to collide with the molten copper while causing the molten copper to drop from the lower portion of a tundish. In particular, if the copper powder is produced by a so-called water atomizing method for spraying a high-pressure water, it is possible to obtain a copper powder having small particle diameters, so that it is possible to improve the electrical conductivity of an electrically conductive paste due to the increase of the number of contact points between the particles when the copper powder is used for preparing the electrically conductive paste.

As a method for coating the copper powder with the silver containing layer, there may be used a method for depositing silver or a silver compound on the surface of a copper powder by a substitution method utilizing a substitution reaction of copper with silver or by a reduction method using a reducing agent. For example, there may be used a method for depositing silver or a silver compound on the surface of a copper powder while stirring a solution containing the copper powder and silver or the silver compound in a solvent, a method for depositing silver or a silver compound on the surface of a copper powder while stirring a mixed solution prepared by mixing a solution, which contains the copper powder and organic substances in a solvent, with a solution containing silver or the silver compound and organic substances in a solvent, and so forth. Furthermore, if a solution containing cyanogen is used when the copper powder is coated with the silver containing layer, the silver containing layer is easy to be ununiform. Therefore, when the copper powder is coated with the silver containing layer, a solution containing cyanogen is not preferably used, so that the silver-coated copper powder does not preferably contain cyanogen before silver is supported on the copper powder.

As the solvent, there may be used water, an organic solvent or a mixed solvent thereof. If a solvent prepared by mixing water with an organic solvent is used, it is required to use an organic solvent which is liquid at room temperature (20 to 30° C.), and the mixing ratio of water to the organic solvent may be suitably adjusted in accordance with the used organic solvent. As water used as the solvent, there may be used distilled water, ion-exchanged water, industrial water or the like unless there is the possibility that impurities are mixed therein.

As raw materials of the silver containing layer, silver nitrate having a high solubility with respect to water and many organic solvents is preferably used since it is required to cause silver ions to exist in the solution. In order to carry out a reaction for coating the copper powder with the silver containing layer (silver coating reaction) as uniform as possible, there is preferably used a silver nitrate solution, which is prepared by dissolving silver nitrate in a solvent (water, an organic solvent or a mixed solvent thereof), not solid silver nitrate. The amount of the silver nitrate solution to be used, the concentration of silver nitrate in the silver nitrate solution, and the amount of the organic solvent may be determined in accordance with the amount of the intended silver containing layer.

In order to more uniformly form the silver containing layer, a chelating agent may be added to the solution. As the chelating agent, there is preferably used a chelating agent having a high complex formation constant with respect to copper ions and so forth, so as to prevent the reprecipitation of copper ions and so forth, which are formed as vice-generative products by a substitution reaction of silver ions with metallic copper. In particular, the chelating agent is preferably selected in view of the complex formation constant with respect to copper since the copper powder serving as the core of the silver-coated copper powder contains copper as a main component. Specifically, as the chelating agent, there may be used a chelating agent selected from the group consisting of ethylene-diamine-tetraacetic acid (EDTA), iminodiacetic acid, diethylene-triamine, triethylene-diamine, and salts thereof.

In order to stably and safely carry out the silver coating reaction, a buffer for pH may be added to the solution. As the buffer for pH, there may be used ammonium carbonate, ammonium hydrogen carbonate, ammonia water, sodium hydrogen carbonate or the like.

When the silver coating reaction is carried out, a solution containing a silver salt is preferably added to a solution in which the copper powder is sufficiently dispersed by stirring the solution after the copper powder is put therein before the silver salt is added thereto. The reaction temperature during this silver coating reaction may be a temperature at which the solidification and evaporation of the reaction solution are not caused. The reaction temperature is set to be preferably 10 to 40° C. and more preferably 15 to 35° C. The reaction time may be set in the range of from 1 minute to 5 hours although it varies in accordance with the coating amount of silver or the silver compound and the reaction temperature.

The preferred embodiment of a silver-coated copper powder according to the present invention is a silver-coated copper powder comprising a copper powder, the surface of which is coated with a silver containing powder. The amount of cyanogen in this silver-coated copper powder is in the range of from 3 ppm to 3000 ppm (preferably in the range of from 3 ppm to 1000 ppm, more preferably in the range of from 3 ppm to 100 ppm, more preferably in the range of from 3 ppm to 10 ppm and most preferably in the range of from 4 ppm to 9 ppm), the amount of cyanogen being obtained by pretreating and analyzing the silver-coated copper powder by the pyridine-pyrazolone absorption spectrophotometry, on the basis of JIS K0102.

In this preferred embodiment of the silver-coated copper powder, the silver containing layer is preferably a layer of silver or a silver compound, and more preferably a layer (silver layer) of 90% by weight or more of silver. The coating amount of the silver containing layer with respect to the silver-coated copper powder is preferably not less than 5% by weight, more preferably in the range of from 7% by weight to 50% by weight, more preferably in the range of from 8% by weight to 40% by weight, and most preferably in the range of from 9% by weight to 20% by weight. The particle diameter ($D_{50}$ diameter) corresponding to 50% of accumulation in cumulative distribution of the copper powder, which is measured by a laser diffraction particle size analyzer, is preferably in the range of from 0.1 μm to 15 μm. The content of each of carbon and nitrogen in the silver-coated copper powder is preferably 0.04% by weight or more. However, if the amount of carbon and/or nitrogen in the silver-coated copper powder is too large, there is some possibility that the electrical conductivity of an electrically conductive paste may be deteriorated when the silver-coated copper powder is used in the electrically conductive paste. Therefore, the content of each of carbon and nitrogen in the silver-coated copper powder is preferably 1% by weight or less, and more preferably 0.3% by weight or less. Moreover, a surface treating agent preferably adheres to the surface of the copper powder coated with the silver containing layer. As this surface treating agent, there is preferably used phytic acid, or an azole such as benzotriazole. The adhering amount of the surface treating agent with respect to the silver-coated copper powder is preferably 0.01 to 1.5% by weight and more preferably 0.05 to 1.0% by weight.

The above-described preferred embodiment of a silver-coated copper powder can be produced by the above-described preferred embodiment of a method for producing a silver-coated copper powder. Furthermore, in the above-described preferred embodiment of a method for producing a silver-coated copper powder, the shape of the copper powder coated with the silver containing layer (the shape of the silver-coated copper powder) may be substantially spherical or flake-shaped.

The above-described preferred embodiment of a silver-coated copper powder can be used as an electric conductor for producing the preferred embodiment of an electrically conductive paste according to the present invention. The electrically conductive paste may contain a solvent and a resin. This solvent can be suitably selected in accordance with the intended purpose of the electrically conductive paste. For example, there can be used by selecting one or more among solvents which include butyl carbitol acetate (BCA), butyl carbitol (BC), ethyl carbitol acetate (ECA), ethyl carbitol (EC), toluene, methyl ethyl ketone, methyl isobutyl ketone, tetradecane, tetralin, propyl alcohol, isopropyl alcohol, dihydroterpineol, dihydroterpineol acetate, ethyl carbitol, 2,2,4-trimethyl-1,3-pentanediol monoisobutyrate (texanol) and so forth. The resin contained in the electrically conductive paste can be suitably selected in accordance with the intended purpose of the electrically conductive paste. For example, there can be used by selecting one or more among resins which include cellulose derivatives such as methyl cellulose and ethyl cellulose, acrylic resin, alkyd resin, polypropylene resin, polyurethane resin, rosin resin, terpene resin, phenol resin, aliphatic petroleum polymer resin, acrylic acid ester resin, xylene resin, coumarone-indene resin, stylene resin, dicyclopentadiene resin, polybutene resin, polyether resin, urea resin, melamine resin, polyvinyl acetate, polyisobutyl resin, thermoplastic elastomer olefin (TPO), epoxy resin, polyester resin and so forth. Among these resins, there are preferably used heat-resistant resins, such as ethyl cellulose, epoxy naphthalene resin (such as epoxy resin having a naphthalene skeleton and four functional groups), polyamide-imide resin and phenol-novolac resin. The electrically conductive paste may contain other components, such as surfactant(s), dispersant(s), rheology control agent(s), silane coupling agent(s) and ion collecting agent(s).

If the above-described preferred embodiment of an electrically conductive paste is used for forming the busbar electrodes of a solar cell, it is possible to improve the power generation efficiency of the solar cell in comparison with an electrically conductive paste using one of conventional silver-coated copper powders. Furthermore, if a surface treating agent is caused to adhere to the surface of a silver-coated copper powder containing cyanogen (a copper powder, the surface of which is coated with a silver containing layer and which contains cyanogen), it is possible to suppress the variation in resistance to oxidation of the silver-coated copper powder. In addition, if such a silver-coated copper powder is used for forming the busbar electrodes of a solar cell, it is possible to suppress the increase in resistance of the electrodes, and it is possible to suppress the decrease in powder generation efficiency of the solar cell.

EXAMPLES

Examples of a silver-coated copper powder and a method for producing the same according to the present invention will be described below in detail.

Example 1

There was prepared a commercially available copper powder produced by atomizing (atomized copper powder SF—Cu 5 μm produced by Nippon Atomized Metal Powders Corporation). The particle size distribution of this copper powder (before being coated with silver) was derived. As a result, the particle diameter ($D_{10}$) corresponding to 10% of accumulation in cumulative distribution of the copper powder was 2.26 μm, the particle diameter ($D_{50}$) corresponding to 50% of accumulation in cumulative distribution of the copper powder was 5.20 μm, and the particle diameter ($D_{90}$) corresponding to 90% of accumulation in cumulative distribution of the copper powder was 9.32 μm. Furthermore, the particle size distribution of the copper powder was measured by means of a laser diffraction particle size analyzer (Micro-Track Particle Size Distribution Measuring Apparatus MT-3300 produced by Nikkiso Co., Ltd.) for deriving the particle diameters $D_{10}$, $D_{50}$ and $D_{90}$ of the copper powder.

Then, a solution (solution 1) was prepared by dissolving 112.6 g of EDTA-4Na (43%) and 9.1 g of ammonium carbonate in 1440 g of pure water, and a solution (solution 2) was prepared by adding 120.9 g of an aqueous silver nitrate solution containing 38.9 g of silver to a solution prepared by dissolving 735 g of EDTA-4Na (43%) and 175 g of ammonium carbonate in 1134 g of pure water.

Then, under a nitrogen atmosphere, 350 g of the above-described copper powder was added to the solution 1, and the temperature thereof was raised to 35° C. while being stirred. Then, the solution 2 was added to the solution in which the copper powder was dispersed, and it was stirred for 30 minutes. Thereafter, it was filtered, washed with water, and dried to obtain a copper powder coated with silver (a silver-coated copper powder). Furthermore, washing with water was carried out by pouring pure water to a solid body, which was obtained by filtering, until the electrical potential of the liquid after washing was decreased to be 0.5 mS/m or less.

Then, 25 g of pure water (25° C.) was added to 20 g of the silver-coated copper powder thus obtained, and 2.95 mL of a silver supporting solution was added thereto to allow a reaction while being stirred for 60 minutes by means of a stirrer. Thereafter, it was filtrated by Nutsche (suction filter) method while pouring water for extrusion thereon. Then, a solid body on the filter paper was washed by pouring pure water thereon (until the electrical potential of the liquid after washing was decreased to be 0.5 mS/m or less), and it was dried at 70° C. for 5 hours by means of a vacuum dryer to obtain a silver-coated copper powder having silver supported on the surface thereof. Furthermore, as the silver supporting solution, there was used 2.95 mL of a silver supporting solution distributed from an aqueous solution containing 100 g/L of potassium silver cyanide, 80 g/L of potassium pyrophosphate and 35 g/L of boric acid. The concentration of each of Ag and Cu in the filtrate was measured by means of an inductively coupled plasma (ICP) mass spectrometer (ICP-MS). As a result, the concentration of Ag in the filtrate was 2 mg/L, and the concentration of Cu therein was 65 mg/L.

After the silver-coated copper powder (having silver supported on the surface thereof) thus obtained was dissolved in aqua regia, pure water was added thereto to be filtrated to collect silver as silver nitrate. Then, the content of Ag was derived from the collected silver nitride by gravimetric method. As a result, the content of Ag in the silver-coated copper powder was 10.77% by weight. Furthermore, the content of Ag in a silver-coated copper powder in Comparative Example 1 which will be described later (a silver-coated copper powder having no silver supported on the surface thereof without being added to a silver supporting solution) was 10.14% by weight. As a result, the amount of silver supported on the surface of the silver-coated copper powder in this example was derived to be 0.63% by weight (=10.77% by weight−10.14% by weight).

The content of each of carbon, nitrogen and oxygen and the amount of cyanogen in the silver-coated copper powder (having silver supported on the surface thereof) were obtained, and the particle size distribution and BET specific surface area of the silver-coated copper powder were obtained.

The content of carbon was measured by means of a carbon/sulfur analyzer (EMIA-810W produced by HORIBA, Ltd.), and the content of each of nitrogen and oxygen was measured by an oxygen/nitrogen/hydrogen analyzer (produced LECO, Ltd.). As a result, the content of carbon in the silver-coated copper powder was 0.13% by weight, the content of nitrogen therein was 0.112% by weight, and the content of oxygen therein was 0.10% by weight.

The amount of cyanogen (CN—) was obtained by carrying out the pretreatment (all cyanogen) of a liquid, which was prepared by distilling 250 mL of water containing 1 g of the weighed silver-coated copper powder in a retort, and analyzing the pretreated liquid by the pyridine-pyrazolone absorption spectrophotometry, on the basis of JIS K0102. As a result, the amount of cyanogen in the silver-coated copper powder was 1400 ppm.

The particle size distribution was measured by means of a laser diffraction particle size analyzer (Micro-Track Particle Size Distribution Measuring Apparatus MT-3300 produced by Nikkiso Co., Ltd.). As a result, the particle diameter ($D_{10}$) corresponding to 10% of accumulation in cumulative distribution of the silver-coated copper powder was 2.5 μm, the particle diameter ($D_{50}$) corresponding to 50% of accumulation in cumulative distribution thereof was 5.0 m, and the particle diameter ($D_{90}$) corresponding to 90% of accumulation in cumulative distribution thereof was 10.0 μm.

The BET specific surface area was measured by means of a BET specific surface area measuring apparatus (4-Sorb US produced by Yuasa Ionics Co., Ltd.) using the single point BET method. As a result, the BET specific surface area of the silver-coated copper powder was 0.29 $m^2/g$.

After 87.0% by weight of the obtained silver-coated copper powder (having silver supported on the surface thereof), 3.8% by weight of an epoxy resin (JER1256 produced by Mitsubishi Chemicals Corporation), 8.6% by weight of butyl carbitol acetate (produced by Wako Pure Chemical Industries, Ltd.) serving as a solvent, 0.5% by weight of a curing agent (M-24 produced by Ajinomoto Fine-Techno Co., Inc.) and 0.1% by weight of oleic acid (produced by Wako Pure Chemical Industries, Ltd.) serving as a dispersant were mixed (preliminarily kneaded) by means of a planetary centrifugal vacuum degassing mixer (Awatori Rentaro produced by Thinky Corporation), the obtained mixture was kneaded by means of a three-roll mill (EXAKT 80S produced by Otto Hermann Inc.) to obtain an electrically conductive paste 1.

In addition, 45 L of industrial ammonia water was added to 502.7 L of a silver nitrate solution containing 21.4 g/L of silver ions to form a silver ammine complex solution. The pH of the formed silver ammine complex solution was adjusted by adding 8.8 L of a sodium hydroxide solution containing 100 g/L of sodium hydroxide thereto. This solution was distilled by adding 462 L of water thereto, and 48 L of industrial formalin serving as a reducing agent was added thereto. Immediately thereafter, 121 g of a stearic acid emulsion containing 16% by weight of stearic acid was added thereto. After a silver slurry thus obtained was filtered and washed with water, it was dried to obtain 21.6 kg of a silver powder. After the surface smoothing treatment of this silver powder was carried out by means of a Henschel mixer (high-speed mixer), the classification thereof was carried out to remove large aggregates of silver being larger than 11 μm. Furthermore, washing with water was carried out by pouring pure water to a solid body, which was obtained by filtering, until the electrical potential of the liquid after washing was decreased to be 0.5 mS/m or less.

Then, after 85.4% by weight of the silver powder thus obtained, 1.2% by weight of ethyl cellulose (produced by Wako Pure Chemical Industries, Ltd.), 7.9% by weight of a solvent (a mixed solvent containing texanol (produced by JMC Co., Ltd.) and butyl carbitol acetate (produced by Wako Pure Chemical Industries, Ltd.) at 1:1), and 1.5% by weight of a glass frit (ASF-1898B produced by Asahi Glass Co., Ltd.) and 3.2% by weight of tellurium dioxide (produced by Wako Pure Chemical Industries, Ltd.) serving as additives were mixed (preliminarily kneaded) by means of a planetary centrifugal vacuum degassing mixer (Awatori Rentaro produced by Thinky Corporation), and then, the obtained mixture was kneaded by means of a three-roll mill (EXAKT 80S produced by Otto Hermann Inc.) to obtain an electrically conductive paste 2.

Then, two silicon wafers (produced by E&M Co., Ltd., 80 Ω/square, 6 inches monocrystal) were prepared. After an aluminum paste (ALSOLAR 14-7021 produced by Toyo Aluminum K.K.) was printed on the backside of each of the silicon wafers by means of a screen printing machine (MT-320T produced by Micro-tech Co., Ltd.), it was dried at 200° C. for 10 minutes by means of a hot air type dryer. Then, after the above-described electrically conductive paste 2 was printed on the surface (front side) of each of the silicon wafers in the shape of 100 finger electrodes, each having a width of 50 μm, by means of the screen printing machine (MT-320T produced by Micro-tech Co., Ltd.), it was dried at 200° C. for 10 minutes by means of the hot air type dryer, and then, it was fired at a peak temperature of 820° C. for an in-out time of 21 seconds in a fast firing IR furnace (Fast Firing Test Four-Chamber Furnace produced by NGK Insulators Ltd.). Thereafter, the electrically conductive paste 1 (the electrically conductive paste 1 produced from the silver-coated copper powder) was printed on the surface (front side) of each of the silicon wafers in the shape of three busbar electrodes, each having a width of 1.3 mm, by means of the screen printing machine (MT-320T produced by Micro-tech Co., Ltd.), and then, it was dried at 200° C. for 40 minutes by means of the hot air type dryer and cured to produce a solar cell.

Then, a cell characteristic test was carried out by irradiating the above-described solar cell with pseudo sunlight having a light irradiation energy of 100 mW/$cm^2$ by means of a xenon lamp of a solar simulator (produced by Wacom Electric Co., Ltd.). As a result, when a short-circuit was established between the output terminals of the solar cell, the current (short circuit current) Isc flowing between the output terminals was 8.651 A. When the output terminals of the solar cell were open, the voltage (open circuit voltage) Voc between the output terminals was 0.623 V. The current density Jsc (the short circuit current Isc per 1 $cm^2$) was 0.0362 A/$cm^2$. The value (fill factor) FF (=Pmax/Voc·Isc) obtained by dividing the maximum output Pmax (=Imax·Vmax) by a product of the open circuit voltage Voc and the current density Jsc was 88.35. The powder generation efficiency Eff (the value obtained by multiplying 100 by a value obtained by dividing the maximum output Pmax by the amount of irradiation light (W) (per 1 $cm^2$) was 19.94%. The series resistance Rs was 0.0043 Ω/square.

Example 2

First, 1.4633 g of potassium gold cyanide (produced by Kojima Chemicals Co., Ltd.), 0.8211 g of anhydrous citric acid (produced by Wako Pure Chemical Industries, Ltd.), 0.1708 g of L-aspartic acid (produced by Wako Pure Chemical Industries, Ltd.) and 0.9998 g of tripotassium citrate monohydrate (produced by Wako Pure Chemical Industries, Ltd.) were added to 100 g of pure water to be stirred at 30° C. for 11 minutes to prepare a gold plating solution.

Then, 100 g of the silver-coated copper powder (the copper powder coated with silver) obtained by the same method as that in Example 1 (before causing silver to be supported on the surface thereof) was added to 150 g of pure water, and 10.299 g of the above-described gold plating solution was added thereto to be stirred at 30° C. for 30 minutes. Thereafter, it was filtrated while pouring water for extrusion thereon. Then, a solid body on the filter paper was washed by pouring pure water thereon (until the electrical potential of the liquid after washing was decreased to be 0.5 mS/m or less), and it was dried at 70° C. for 5 hours by means of a vacuum dryer to obtain a silver-coated copper powder having gold supported on the surface thereof. Furthermore, the amount of filtrate was 650 g, and the concentration of each of Au, Ag and Cu in the filtrate was measured by the same methods as those in Example 1. As a result, the concentration of Au in the filtrate was 2 mg/L, the concentration of Ag therein was less than 1 mg/L, and the concentration of Cu therein was 150 mg/L.

After the silver-coated copper powder (having gold supported on the surface thereof) thus obtained was dissolved in aqua regia, pure water was added thereto to be filtrated to collect silver as silver nitrate. Then, the content of Au in the filtrate was measured by means of the ICP mass spectrometer (ICP-MS), and the content of Ag in the silver-coated copper powder was derived from the collected silver nitride by gravimetric method. As a result, the content of Au in the silver-coated copper powder was 0.10% by weight, and the content of Ag in the silver-coated copper powder was 10.04% by weight.

By the same methods at those in Example 1, the content of each of carbon, nitrogen and oxygen and the amount of cyanogen in the silver-coated copper powder (having gold supported on the surface thereof) were obtained, and the particle size distribution and BET specific surface area of the silver-coated copper powder were obtained. As a result, the content of carbon in the silver-coated copper powder was 0.04% by weight, the content of nitrogen therein was 0.18% by weight, and the content of oxygen therein was 0.08% by weight. The amount of cyanogen in the silver-coated copper powder was 220 ppm. The particle diameter ($D_{10}$) corresponding to 10% of accumulation in cumulative distribution of the silver-coated copper powder was 2.5 μm, the particle diameter ($D_{50}$) corresponding to 50% of accumulation in cumulative distribution thereof was 5.0 μm, and the particle diameter ($D_{90}$) corresponding to 90% of accumulation in cumulative distribution thereof was 10.0 μm. The BET specific surface area of the silver-coated copper powder was 0.34 m²/g.

A solar cell was produced by the same method as that in Example 1, except that an electrically conductive paste 1 obtained from the obtained silver-coated copper powder (having gold supported on the surface thereof) was used, and the cell characteristic test thereof was carried out by the same method as that in Example 1. As a result, the short circuit current Isc was 8.670 A, and the open circuit voltage Voc was 0.629 V. The current density Jsc was 0.0363 A/cm², and the fill factor FF was 88.11. The powder generation efficiency Eff was 20.12%, and the series resistance Rs was 0.0042 Ω/square.

Example 3

The silver-coated copper powder (the copper powder coated with silver) obtained by the same method as that in Example 1 (before causing silver to be supported on the surface thereof) was dipped in an aqueous solution of NaCN containing 1000 ppm of cyanogen (CN) for 30 minutes. Thereafter, it was filtrated while pouring water for extrusion thereon. Then, a solid body on the filter paper was washed by pouring pure water thereon (until the electrical potential of the liquid after washing was decreased to be 0.5 mS/m or less), and it was dried at 70° C. for 5 hours by means of a vacuum dryer to obtain a silver-coated copper powder having CN adsorbed on the surface thereof.

After the silver-coated copper powder (having CN adsorbed on the surface thereof) thus obtained was dissolved in aqua regia, pure water was added thereto to be filtrated to collect silver as silver nitrate. Then, the content of Ag in the silver-coated copper powder was derived from the collected silver nitride by gravimetric method. As a result, the content of Ag in the silver-coated copper powder was 10.14% by weight.

By the same methods at those in Example 1, the content of each of carbon, nitrogen and oxygen and the amount of cyanogen in the silver-coated copper powder (having CN adsorbed on the surface thereof) were obtained, and the particle size distribution and BET specific surface area of the silver-coated copper powder were obtained. As a result, the content of carbon in the silver-coated copper powder was 0.05% by weight, the content of nitrogen therein was 0.06% by weight, and the content of oxygen therein was 0.12% by weight. The amount of cyanogen in the silver-coated copper powder was 620 ppm. The particle diameter ($D_{10}$) corresponding to 10% of accumulation in cumulative distribution of the silver-coated copper powder was 3.0 μm, the particle diameter ($D_{50}$) corresponding to 50% of accumulation in cumulative distribution thereof was 6.2 μm, and the particle diameter ($D_{90}$) corresponding to 90% of accumulation in cumulative distribution thereof was 10.3 μm. The BET specific surface area of the silver-coated copper powder was 0.32 m²/g.

A solar cell was produced by the same method as that in Example 1, except that an electrically conductive paste 1 obtained from the obtained silver-coated copper powder (having CN adsorbed on the surface thereof) was used, and the cell characteristic test thereof was carried out by the same method as that in Example 1. As a result, the short circuit current Isc was 8.885 A, and the open circuit voltage Voc was 0.626 V. The current density Jsc was 0.0372 A/cm², and the fill factor FF was 87.02. The powder generation efficiency Eff was 20.25%, and the series resistance Rs was 0.0042 Ω/square.

Comparative Example 1

After the silver-coated copper powder (the copper powder coated with silver) obtained by the same method as that in Example 1 (before causing silver to be supported on the surface thereof) was dissolved in aqua regia, pure water was added thereto to be filtrated to collect silver as silver nitrate. Then, the content of Ag in the silver-coated copper powder was derived from the collected silver nitride by gravimetric method. As a result, the content of Ag in the silver-coated copper powder was 10.14% by weight.

By the same methods at those in Example 1, the content of each of carbon, nitrogen and oxygen and the amount of cyanogen in the silver-coated copper powder were obtained, and the particle size distribution and BET specific surface area of the silver-coated copper powder were obtained. As a result, the content of carbon in the silver-coated copper powder was 0.02% by weight, the content of nitrogen therein was 0.007% by weight, and the content of oxygen therein was 0.08% by weight. The amount of cyanogen in the silver-coated copper powder was 0 ppm. The particle diameter ($D_{10}$) corresponding to 10% of accumulation in cumulative distribution of the silver-coated copper powder was 2.5 µm, the particle diameter ($D_{50}$) corresponding to 50% of accumulation in cumulative distribution thereof was 5.2 m, and the particle diameter ($D_{90}$) corresponding to 90% of accumulation in cumulative distribution thereof was 10.1 µm. The BET specific surface area of the silver-coated copper powder was 0.31 m²/g.

A solar cell was produced by the same method as that in Example 1, except that an electrically conductive paste 1 obtained from the obtained silver-coated copper powder (the copper powder coated with silver) was used, and the cell characteristic test thereof was carried out by the same method as that in Example 1. As a result, the short circuit current Isc was 8.718 A, and the open circuit voltage Voc was 0.627 V. The current density Jsc was 0.0365 A/cm², and the fill factor FF was 80.04. The powder generation efficiency Eff was 18.34%, and the series resistance Rs was 0.0058 Ω/square.

Comparative Example 2

A commercially available silver powder (atomized silver powder HWQ 5 µm produced by Fukuda Metal Foil & Powder Co., Ltd.) produced by the atomizing method was prepared. By the same methods at those in Example 1, the content of each of silver, carbon, nitrogen and oxygen and the amount of cyanogen in the prepared silver powder were obtained, and the particle size distribution of the silver powder was obtained. As a result, the content of silver in the silver powder was not less than 99.9% by weight, and the content of carbon therein was 0.006% by weight. The content of nitrogen in the silver powder was less than 0.01% by weight, and the content of oxygen therein was 0.03% by weight. The amount of cyanogen in the silver powder was 0 ppm. The particle diameter ($D_{10}$) corresponding to 10% of accumulation in cumulative distribution of the silver powder was 2.9 µm, the particle diameter ($D_{50}$) corresponding to 50% of accumulation in cumulative distribution thereof was 4.8 µm, and the particle diameter ($D_{90}$) corresponding to 90% of accumulation in cumulative distribution thereof was 8.0 µm. The BET specific surface area of the silver powder was 0.16 m²/g.

A solar cell was produced by the same method as that in Example 1, except that an electrically conductive paste 1 obtained from the silver powder was used, and the cell characteristic test thereof was carried out by the same method as that in Example 1. As a result, the short circuit current Isc was 8.885 A, and the open circuit voltage Voc was 0.626 V. The current density Jsc was 0.0372 A/cm², and the fill factor FF was 86.60. The powder generation efficiency Eff was 20.18%, and the series resistance Rs was 0.0040 Ω/square.

Comparative Example 3

The same silver powder as that in Comparative Example 2 was dipped in an aqueous solution of NaCN containing 1000 ppm of cyanogen (CN) for 30 minutes. Thereafter, it was filtrated while pouring water for extrusion thereon. Then, a solid body on the filter paper was washed by pouring pure water thereon (until the electrical potential of the liquid after washing was decreased to be 0.5 mS/m or less), and it was dried at 70° C. for 5 hours by means of a vacuum dryer to obtain a silver powder having CN adsorbed on the surface thereof. By the same methods at those in Example 1, the content of each of silver, carbon, nitrogen and oxygen and the amount of cyanogen in the silver powder (having CN adsorbed on the surface thereof) were obtained, and the particle size distribution of the silver powder was obtained. As a result, the content of silver in the silver powder was not less than 99.9% by weight, and the content of carbon therein was 0.005% by weight. The content of nitrogen in the silver powder was less than 0.01% by weight, and the content of oxygen therein was 0.02% by weight. The amount of cyanogen in the silver powder was 3 ppm. The particle diameter ($D_{10}$) corresponding to 10% of accumulation in cumulative distribution of the silver powder was 3.7 µm, the particle diameter ($D_{50}$) corresponding to 50% of accumulation in cumulative distribution thereof was 8.4 µm, and the particle diameter ($D_{90}$) corresponding to 90% of accumulation in cumulative distribution thereof was 16.5 µm. The BET specific surface area of the silver powder was 0.18 m²/g.

A solar cell was produced by the same method as that in Example 1, except that an electrically conductive paste 1 obtained from the silver powder was used, and the cell characteristic test thereof was carried out by the same method as that in Example 1. As a result, the short circuit current Isc was 8.861 A, and the open circuit voltage Voc was 0.627 V. The current density Jsc was 0.0371 A/cm², and the fill factor FF was 84.03. The powder generation efficiency Eff was 19.58%, and the series resistance Rs was 0.0044 Ω/square.

Comparative Example 4

While a liquid obtained by adding 100 g of the same copper powder as that in Example 1 to 500 g of pure water was stirred at 500 rpm by means of a stirrer, 239.28 g of a cyanide containing silver plating solution comprising 100 g/L of potassium silver cyanide, 80 g/L of potassium pyrophosphate and 35 g/L of boric acid was added, in 30 minutes, to the liquid containing the copper powder dispersed therein by stirring, and thereafter, stirring was continued for 30 minutes to obtain a silver-plated copper powder.

By the same methods at those in Example 1, the content of each of silver, carbon, nitrogen and oxygen and the amount of cyanogen in the silver-plated copper powder were obtained, and the particle size distribution and BET specific surface area of the silver-plated copper powder were obtained. As a result, the content of silver in the silver-plated copper powder was 8.10% by weight, and the content of carbon therein was 1.36% by weight. The content of nitrogen in the silver-plated copper powder was 1.53% by weight, and the content of oxygen therein was 0.19% by weight. The amount of cyanogen in the silver-plated copper powder was 7100 ppm. The particle diameter ($D_{10}$) corresponding to 10% of accumulation in cumulative distribution of the silver-plated copper powder was 3.1 µm, the particle diameter ($D_{50}$) corresponding to 50% of accumulation in cumulative distribution thereof was 7.7 m, and the particle diameter ($D_{90}$) corresponding to 90% of accumulation in cumulative distribution thereof was 16.4 m. The BET specific surface area of the silver-plated copper powder was 0.53 m²/g.

A solar cell was produced by the same method as that in Example 1, except that an electrically conductive paste 1 obtained from the obtained silver-plated copper powder was used, and the cell characteristic test thereof was carried out by the same method as that in Example 1. As a result, the short circuit current Isc was 2.221 A, and the open circuit voltage Voc was 0.626 V. The current density Jsc was 0.0093 A/cm², and the fill factor FF was 73.49. The powder generation efficiency Eff was 4.35%, and the series resistance Rs was 0.1077 Ω/square.

Example 4

A silver-coated copper powder (having silver supported on the surface thereof) was obtained by the same method as that in Example 1, except that a commercially available copper powder (atomized copper powder AO-PCG-19 produced by DOWA ELECTRONICS MATERIALS CO., LTD.) produced by the atomizing method was used in place of the copper powder in Example 1. The particle size distribution of the used copper powder was derived by the same method as that in Example 1. As a result, the particle diameter ($D_{10}$) corresponding to 10% of accumulation in cumulative distribution of the copper powder was 2.0 μm, the particle diameter ($D_{50}$) corresponding to 50% of accumulation in cumulative distribution of the copper powder was 4.9 μm, and the particle diameter ($D_{90}$) corresponding to 90% of accumulation in cumulative distribution of the copper powder was 9.5 m.

The content of Ag in the silver-coated copper powder (having silver supported on the surface thereof) thus obtained was derived by the same method as that in Example 1. As a result, the content of Ag in the silver-coated copper powder was 11.89% by weight. Furthermore, the content of Ag in a silver-coated copper powder in Comparative Example 5 which will be described later (a silver-coated copper powder having no silver supported on the surface thereof without being added to a silver supporting solution) was 10.93% by weight. As a result, the amount of silver supported on the surface of the silver-coated copper powder in this example was derived to be 0.96% by weight (=11.89% by weight−10.93% by weight).

By the same methods at those in Example 1, the content of each of carbon, nitrogen and oxygen and the amount of cyanogen in the silver-coated copper powder (having silver supported on the surface thereof) were obtained, and the particle size distribution and BET specific surface area of the silver-coated copper powder were obtained. As a result, the content of carbon in the silver-coated copper powder was 0.16% by weight, the content of nitrogen therein was 0.15% by weight, and the content of oxygen therein was 0.13% by weight. The amount of cyanogen in the silver-coated copper powder was 900 ppm. The particle diameter ($D_{10}$) corresponding to 10% of accumulation in cumulative distribution of the silver-coated copper powder was 2.9 μm, the particle diameter ($D_{50}$) corresponding to 50% of accumulation in cumulative distribution thereof was 6.5 μm, and the particle diameter ($D_{90}$) corresponding to 90% of accumulation in cumulative distribution thereof was 13.2 m. The BET specific surface area of the silver-coated copper powder was 0.41 m$^2$/g.

A solar cell was produced by the same method as that in Example 1, except that an electrically conductive paste 1 obtained from the obtained silver-coated copper powder (having silver supported on the surface thereof) was used and that silicon wafers (produced by E&M Co., Ltd., 100 Ω/square, 6 inches monocrystal) were substituted for the silicon wafers (produced by E&M Co., Ltd., 80 Ω/square, 6 inches monocrystal), and the cell characteristic test thereof was carried out by the same method as that in Example 1. As a result, the short circuit current Isc was 9.24 A, and the open circuit voltage Voc was 0.636 V. The current density Jsc was 0.0380 A/cm$^2$, and the fill factor FF was 85.58. The powder generation efficiency Eff was 20.72%, and the series resistance Rs was 0.0041 Ω/square.

Example 5

A silver-coated copper powder (having silver supported on the surface thereof) was obtained by the same method as that in Example 4, except that the amount of the silver supporting solution to be added was 0.056 mL.

The content of Ag in the silver-coated copper powder (having silver supported on the surface thereof) thus obtained was derived by the same method as that in Example 1. As a result, the content of Ag in the silver-coated copper powder was 11.26% by weight. Furthermore, the content of Ag in a silver-coated copper powder in Comparative Example 5 which will be described later (a silver-coated copper powder having no silver supported on the surface thereof without being added to a silver supporting solution) was 10.93% by weight. As a result, the amount of silver supported on the surface of the silver-coated copper powder in this example was derived to be 0.33% by weight (=11.26% by weight−10.93% by weight).

By the same methods at those in Example 1, the content of each of carbon, nitrogen and oxygen and the amount of cyanogen in the silver-coated copper powder (having silver supported on the surface thereof) were obtained, and the particle size distribution and BET specific surface area of the silver-coated copper powder were obtained. As a result, the content of carbon in the silver-coated copper powder was 0.01% by weight, the content of nitrogen therein was less than 0.01% by weight, and the content of oxygen therein was 0.10% by weight. The amount of cyanogen in the silver-coated copper powder was 5 ppm. The particle diameter ($D_{10}$) corresponding to 10% of accumulation in cumulative distribution of the silver-coated copper powder was 2.6 μm, the particle diameter ($D_{50}$) corresponding to 50% of accumulation in cumulative distribution thereof was 5.6 μm, and the particle diameter ($D_{90}$) corresponding to 90% of accumulation in cumulative distribution thereof was 10.9 μm. The BET specific surface area of the silver-coated copper powder was 0.31 m$^2$/g.

A solar cell was produced by the same method as that in Example 4, except that an electrically conductive paste 1 obtained from the obtained silver-coated copper powder (having silver supported on the surface thereof) was used, and the cell characteristic test thereof was carried out by the same method as that in Example 4. As a result, the short circuit current Isc was 9.33 A, and the open circuit voltage Voc was 0.636 V. The current density Jsc was 0.0384 A/cm$^2$, and the fill factor FF was 90.35. The powder generation efficiency Eff was 22.06%, and the series resistance Rs was 0.0039 Ω/square.

Example 6

First, 20 g of the silver-coated copper powder (having silver supported on the surface thereof) obtained in Example 5 was added to pure water to be dispersed therein. In this state, 0.2 g of phytic acid was added thereto. Thereafter, it was filtrated by Nutsche method while pouring water for extrusion thereon. Then, a solid body on the filter paper was dried at 70° C. for 5 hours by means of a vacuum dryer to coat the surface of the silver-coated copper powder (having silver supported on the surface thereof) with phytic acid.

The content of Ag in the silver-coated copper powder (having the surface treated with phytic acid after causing silver to be supported on the surface thereof) thus obtained was derived by the same method as that in Example 1. As a result, the content of Ag in the silver-coated copper powder was 11.39% by weight.

By the same methods at those in Example 1, the content of each of carbon, nitrogen and oxygen and the amount of cyanogen in the silver-coated copper powder (having the surface treated with phytic acid after causing silver to be supported on the surface thereof) were obtained, and the particle size distribution and BET specific surface area of the silver-coated copper powder were obtained. As a result, the content of carbon in the silver-coated copper powder was 0.02% by weight, the content of nitrogen therein was 0.01% by weight, and the content of oxygen therein was 0.12% by weight. The amount of cyanogen in the silver-coated copper powder was 5.7 ppm. The particle diameter ($D_{10}$) corresponding to 10% of accumulation in cumulative distribution of the silver-coated copper powder was 2.7 µm, the particle diameter ($D_{50}$) corresponding to 50% of accumulation in cumulative distribution thereof was 5.9 µm, and the particle diameter ($D_{90}$) corresponding to 90% of accumulation in cumulative distribution thereof was 10.7 m. The BET specific surface area of the silver-coated copper powder was 0.31 m$^2$/g.

Then, about 5 to 10 mL of ion-exchanged water and 5 mL of nitric acid (reagent for accurate analysis (UGR)) were added to 1 g of the obtained silver-coated copper powder (having the surface treated with phytic acid after causing silver to be supported on the surface thereof) to be heated, allowed to be cooled, and then, diluted to obtain a constant volume of 100 mL to measure the content of phosphorus in the silver-coated copper powder by means of an inductively coupled plasma atomic emission spectrometric analyzer (ICP-OES) (SPS-5100 produced by Hitachi Hi-Technologies Corporation). As a result, the content of phosphorus was 0.034% by weight. The amount of phytic acid adhering to the surface of the silver-coated copper powder (the adhering amount of the surface treating agent) was calculated from the content of phosphorus therein. As a result, the amount of phytic acid was 0.12% by weight.

A solar cell was produced by the same method as that in Example 4, except that an electrically conductive paste 1 obtained from the obtained silver-coated copper powder (having the surface treated with phytic acid after causing silver to be supported on the surface thereof) was used, and the cell characteristic test thereof was carried out by the same method as that in Example 4. As a result, the short circuit current Isc was 9.33 A, and the open circuit voltage Voc was 0.641 V. The current density Jsc was 0.0384 A/cm$^2$, and the fill factor FF was 88.81. The powder generation efficiency Eff was 21.88%, and the series resistance Rs was 0.0035 Ω/square.

Example 7

First, 20 g of the silver-coated copper powder (having silver supported on the surface thereof) obtained in Example 5 was added to pure water to be dispersed therein. In this state, 0.1 g of benzotriazole was added thereto. Thereafter, it was filtrated by Nutsche method while pouring water for extrusion thereon. Then, a solid body on the filter paper was dried at 70° C. for 5 hours by means of a vacuum dryer to treat the surface of the silver-coated copper powder (having silver supported on the surface thereof) with benzotriazole.

The content of Ag in the silver-coated copper powder (having the surface treated with benzotriazole after causing silver to be supported on the surface thereof) thus obtained was derived by the same method as that in Example 1. As a result, the content of Ag in the silver-coated copper powder was 11.50% by weight.

By the same methods at those in Example 1, the content of each of carbon, nitrogen and oxygen and the amount of cyanogen in the silver-coated copper powder (having the surface treated with benzotriazole after causing silver to be supported on the surface thereof) were obtained, and the particle size distribution and BET specific surface area of the silver-coated copper powder were obtained. As a result, the content of carbon in the silver-coated copper powder was 0.05% by weight, the content of nitrogen therein was 0.02% by weight, and the content of oxygen therein was 0.10% by weight. The amount of cyanogen in the silver-coated copper powder was 7 ppm. The amount of benzotriazole adhering to the silver-coated copper powder (the adhering amount of the surface treating agent) was calculated from the content of nitrogen therein. As a result, the amount of benzotriazole was 0.06% by weight. The particle diameter ($D_{10}$) corresponding to 10% of accumulation in cumulative distribution of the silver-coated copper powder was 2.6 µm, the particle diameter ($D_{50}$) corresponding to 50% of accumulation in cumulative distribution thereof was 5.8 µm, and the particle diameter ($D_{90}$) corresponding to 90% of accumulation in cumulative distribution thereof was 10.5 µm. The BET specific surface area of the silver-coated copper powder was 0.40 m$^2$/g.

A solar cell was produced by the same method as that in Example 4, except that an electrically conductive paste 1 obtained from the obtained silver-coated copper powder (having the surface treated with benzotriazole after causing silver to be supported on the surface thereof) was used, and the cell characteristic test thereof was carried out by the same method as that in Example 4. As a result, the short circuit current Isc was 9.30 A, and the open circuit voltage Voc was 0.641 V. The current density Jsc was 0.0383 A/cm$^2$, and the fill factor FF was 88.91. The powder generation efficiency Eff was 21.81%, and the series resistance Rs was 0.0044 Ω/square.

Comparative Example 5

After the silver-coated copper powder (the copper powder coated with silver) obtained by the same method as that in Example 4 (before causing silver to be supported on the surface thereof) was dissolved in aqua regia, pure water was added thereto to be filtrated to collect silver as silver nitrate. Then, the content of Ag in the silver-coated copper powder was derived from the collected silver nitride by gravimetric method. As a result, the content of Ag in the silver-coated copper powder was 10.93% by weight.

By the same methods at those in Example 1, the content of each of carbon, nitrogen and oxygen and the amount of cyanogen in the silver-coated copper powder were obtained, and the particle size distribution and BET specific surface area of the silver-coated copper powder were obtained. As a result, the content of carbon in the silver-coated copper powder was 0.01% by weight, the content of nitrogen therein was less than 0.01% by weight, and the content of oxygen therein was 0.10% by weight. The amount of cyanogen in the silver-coated copper powder was 0 ppm. The particle diameter ($D_{10}$) corresponding to 10% of accumulation in cumulative distribution of the silver-coated copper powder was 2.5 µm, the particle diameter ($D_{50}$) corresponding to 50% of accumulation in cumulative distribution thereof was 5.8 µm, and the particle diameter ($D_{90}$) corresponding to 90% of accumulation in cumulative distribution thereof was 11.6 μm. The BET specific surface area of the silver-coated copper powder was 0.35 m²/g.

A solar cell was produced by the same method as that in Example 1, except that an electrically conductive paste 1 obtained from the obtained silver-coated copper powder (the copper powder coated with silver) was used, and the cell characteristic test thereof was carried out by the same method as that in Example 1. As a result, the short circuit current Isc was 9.21 A, and the open circuit voltage Voc was 0.632 V. The current density Jsc was 0.0379 A/cm², and the fill factor FF was 82.73. The powder generation efficiency Eff was 19.83%, and the series resistance Rs was 0.0055 Ω/square.

The results of these examples and comparative examples are shown in Tables 1-3.

TABLE 1

|  | Ag (wt %) | Au (wt %) | C (wt %) | N (wt %) | O (wt %) | P (wt %) | CN— (ppm) | Surface Treating Agent (wt %) |
|---|---|---|---|---|---|---|---|---|
| Ex. 1 | 10.77 | — | 0.13 | 0.112 | 0.10 | — | 1400 | — |
| Ex. 2 | 10.04 | 0.10 | 0.04 | 0.18 | 0.08 | — | 220 | — |
| Ex. 3 | 10.14 | — | 0.05 | 0.06 | 0.12 | — | 620 | — |
| Ex. 4 | 11.89 | — | 0.16 | 0.15 | 0.13 | — | 900 | — |
| Ex. 5 | 11.26 | — | 0.01 | <0.01 | 0.10 | — | 5 | — |
| Ex. 6 | 11.39 | — | 0.02 | <0.01 | 0.12 | 0.034 | 5.7 | 0.12 |
| Ex. 7 | 11.50 | — | 0.05 | 0.02 | 0.10 | — | 7 | 0.06 |
| Comp. 1 | 10.14 | — | 0.02 | 0.007 | 0.08 | — | 0 | — |
| Comp. 2 | >99.9 | — | 0.006 | 0 | 0.03 | — | 0 | — |
| Comp. 3 | >99.9 | — | 0.005 | <0.01 | 0.02 | — | 3 | — |
| Comp. 4 | 8.10 | — | 1.36 | 1.53 | 0.19 | — | 7100 | — |
| Comp. 5 | 10.93 | — | 0.01 | <0.01 | 0.10 | — | 0 | — |

TABLE 2

|  | Particle Size Distribution (μm) | | | BET (cm²/g) |
|---|---|---|---|---|
|  | D₁₀ | D₅₀ | D₉₀ |  |
| Ex. 1 | 2.5 | 5.0 | 10.0 | 0.29 |
| Ex. 2 | 2.5 | 5.0 | 10.0 | 0.34 |
| Ex. 3 | 3.0 | 6.2 | 10.3 | 0.32 |
| Ex. 4 | 2.9 | 6.4 | 13.2 | 0.41 |
| Ex. 5 | 2.6 | 5.6 | 10.9 | 0.31 |
| Ex. 6 | 2.7 | 5.9 | 10.7 | 0.31 |
| Ex. 7 | 2.6 | 5.8 | 10.5 | 0.40 |
| Comp. 1 | 2.5 | 5.2 | 10.1 | 0.31 |
| Comp. 2 | 2.9 | 4.8 | 8.0 | 0.16 |
| Comp. 3 | 3.7 | 8.4 | 16.5 | 0.18 |
| Comp. 4 | 3.1 | 7.7 | 16.4 | 0.53 |
| Comp. 5 | 2.5 | 5.8 | 11.6 | 0.35 |

TABLE 3

|  | Voc (V) | Jsc (A/cm²) | FF | Conversion Efficiency Eff (%) | Rs (Ω/□) |
|---|---|---|---|---|---|
| Ex. 1 | 0.623 | 0.0362 | 88.35 | 19.94 | 0.0043 |
| Ex. 2 | 0.629 | 0.0363 | 88.11 | 20.12 | 0.0042 |
| Ex. 3 | 0.626 | 0.0372 | 87.02 | 20.25 | 0.0042 |
| Ex. 4 | 0.636 | 0.0380 | 85.58 | 20.72 | 0.0041 |
| Ex. 5 | 0.636 | 0.0384 | 90.35 | 22.06 | 0.0039 |
| Ex. 6 | 0.641 | 0.0384 | 88.81 | 21.88 | 0.0035 |
| Ex. 7 | 0.641 | 0.0383 | 88.91 | 21.81 | 0.0044 |
| Comp. 1 | 0.627 | 0.0365 | 80.04 | 18.34 | 0.0058 |
| Comp. 2 | 0.626 | 0.0372 | 86.60 | 20.18 | 0.0040 |
| Comp. 3 | 0.627 | 0.0371 | 84.03 | 19.58 | 0.0044 |
| Comp. 4 | 0.626 | 0.0093 | 73.49 | 4.35 | 0.1077 |
| Comp. 5 | 0.632 | 0.0379 | 82.73 | 19.83 | 0.0055 |

As can be seen from Tables 1-3, if the electrically conductive paste using the silver-coated copper powder (containing 3 to 3000 ppm of cyanogen) in Examples 1-7 is used for forming the busbar electrodes of the solar cell, it is possible to greatly improve the conversion efficiency Eff of the solar cell (to the same degree as that in case of the silver powder in Comparative Example 2) in comparison with the cases where there were used the silver-coated copper powder (containing no cyanogen) in Comparative Examples 1 and 5 and the silver-plated copper powder (containing a large amount of cyanogen) in Comparative Example 4.

Furthermore, in Example 3 and Comparative Example 3, the silver-coated copper powder (the copper powder coated with silver) (before causing silver to be supported on the surface thereof) and the commercially available silver powder were dipped in the aqueous solution of NaCN on the same conditions, respectively. However, the amount of cyanogen in the silver powder in Comparative Example 3 is far smaller than the amount of cyanogen in the silver-coated copper powder in Example 3, and the powder generation efficiency of the solar cell using the electrically conductive paste obtained from the silver powder in Comparative Example 3 is far lower than the powder generation efficiency of the solar cell using the electrically conductive paste obtained from the silver-coated copper powder in Example 3. It is considered that this reason is that the silver-coated copper powder (the copper powder coated with silver) (before causing silver to be supported to the surface thereof) used in Example 3 suitably has portions, which are not coated with silver, on the surface of the easily oxidizable copper powder, so that the silver-coated copper powder suitably contains cyanogen by the reaction of copper ions with cyanogen when it is dipped in the aqueous solution of NaCN.

The solar cell produced in each of Examples 4-7 and Comparative Example 5 was irradiated with pseudo sunlight having a light irradiation energy of 100 mW/cm² for 5 seconds to be continuously repeated by means of a xenon lamp of a solar simulator (produced by Wacom Electric Co., Ltd.), and the powder generation efficiency Eff per irradiation was derived to examine the change in the powder generation efficiency Eff with time. As shown in FIG. 1, it can be seen that the powder generation efficiency Eff of the solar cell in Example 5 is slightly decreased by the repeated irradiation although the initial powder generation efficiency Eff thereof is highest and that the powder generation efficiency Eff of each of the solar cells in Examples 6 and 7 using the silver-coated copper powder surface-treated with phytic acid and benzotriazole, respectively, is not decreased by the repeated irradiation although the initial powder generation efficiency Eff thereof is slightly lower than that of the solar cell in Example 5, so that the solar cells in Examples 6 and 7 have high reliability. In particular, the powder generation efficiency Eff of the solar cell using the silver-coated copper powder surface-treated with phytic acid in Example 6 was higher than the powder generation efficiency Eff of the solar cell in Example 5 when the number of times of light irradiation exceeds eight.

INDUSTRIAL APPLICABILITY

The silver-coated copper powder according to the present invention can be utilized for producing an electrically conductive paste for use in electrically conductive patterns of circuit boards, and electronic parts, such as electrodes and circuits of substrates of solar cells and so forth.

The invention claimed is:

1. A method for producing a silver-coated copper powder, the method comprising the steps of:
preparing a copper powder, the surface of which is coated with a silver containing layer; and
adding the copper powder to a cyanide solution to cause the copper powder coated with the silver containing layer to contain 3 to 3000 ppm of cyanogen,
wherein a particle diameter ($D_{50}$ diameter) corresponding to 50% of accumulation in cumulative distribution of said copper powder, which is measured by a laser diffraction particle size analyzer, is in the range of from 0.1 μm to 15 μm.

2. A method for producing a silver-coated copper powder as set forth in claim 1, wherein said silver containing layer is a layer of silver or a silver compound.

3. A method for producing a silver-coated copper powder as set forth in claim 1, wherein said silver containing layer is a layer of silver.

4. A method for producing a silver-coated copper powder as set forth in claim 1, wherein the amount of said silver containing layer with respect to said silver-coated copper powder is not less than 5% by weight.

5. A method for producing a silver-coated copper powder as set forth in claim 1, wherein said copper powder coated with the silver containing layer contains no cyanogen before the copper powder coated with the silver containing layer is added to the cyanide solution.

6. A method for producing a silver-coated copper powder as set forth in claim 1, wherein said cyanide solution is a potassium silver cyanide solution, a potassium gold cyanide solution, a potassium cyanide solution or a sodium cyanide solution.

7. A method for producing a silver-coated copper powder as set forth in claim 3, wherein the content of cyanogen in said silver-coated copper powder is in the range of from 3 ppm to 10 ppm.

8. A method for producing a silver-coated copper powder, the method comprising the steps of:
preparing a copper powder, the surface of which is coated with a silver containing layer; and
adding the copper powder to a cyanide solution to cause the copper powder coated with the silver containing layer to contain 3 to 3000 ppm of cyanogen,
wherein a surface treating agent is caused to adhere to the surface of the copper powder coated with the silver containing layer, after the copper powder coated with the silver containing layer is caused to contain cyanogen, and
wherein said surface treating agent is phytic acid or an azole.

9. A method for producing a silver-coated copper powder as set forth in claim 8, wherein said silver containing layer is a layer of silver or a silver compound.

10. A method for producing a silver-coated copper powder as set forth in claim 8, wherein said silver containing layer is a layer of silver.

11. A method for producing a silver-coated copper powder as set forth in claim 8, wherein the amount of said silver containing layer with respect to said silver-coated copper powder is not less than 5% by weight.

12. A method for producing a silver-coated copper powder as set forth in claim 8, wherein said copper powder coated with the silver containing layer contains no cyanogen before the copper powder coated with the silver containing layer is added to the cyanide solution.

13. A method for producing a silver-coated copper powder as set forth in claim 8, wherein said cyanide solution is a potassium silver cyanide solution, a potassium gold cyanide solution, a potassium cyanide solution or a sodium cyanide solution.

14. A method for producing a silver-coated copper powder as set forth in claim 10, wherein the content of cyanogen in said silver-coated copper powder is in the range of from 3 ppm to 10 ppm.

15. A silver-coated copper powder comprising:
a silver coating layer; and
a copper powder, the surface of which is coated with the silver containing powder,
wherein the amount of cyanogen in the silver-coated copper powder is in the range of from 3 ppm to 3000 ppm,
wherein the amount of said silver containing layer with respect to said silver-coated copper powder is not less than 5% by weight.

16. A silver-coated copper powder as set forth in claim 15, wherein said silver containing layer is a layer of silver or a silver compound.

17. A silver-coated copper powder as set forth in claim 15, wherein said silver containing layer is a layer of silver.

18. An electrically conductive paste wherein a silver-coated copper powder as set forth in claim 15 is used as an electric conductor.

19. An electrically conductive paste comprising:
a solvent;
a resin; and
a silver-coated copper powder as set forth in claim 15 as an electrically conductive powder.

20. A silver-coated copper powder as set forth in claim 17, wherein the content of cyanogen in said silver-coated copper powder is in the range of from 3 ppm to 10 ppm.

21. A method for producing an electrode for solar cell, the method comprising the steps of:
applying an electrically conductive paste as set forth in claim 18 on a substrate; and
curing the electrically conductive paste to form an electrode on the surface of the substrate.

22. A silver-coated copper powder comprising:
a silver coating layer; and
a copper powder, the surface of which is coated with the silver containing powder,
wherein the amount of cyanogen in the silver-coated copper powder is in the range of from 3 ppm to 3000 ppm, and
wherein a particle diameter ($D_{50}$ diameter) corresponding to 50% of accumulation in cumulative distribution of said copper powder, which is measured by a laser diffraction particle size analyzer, is in the range of from 0.1 µm to 15 µm.

23. A silver-coated copper powder comprising:
a silver coating layer; and
a copper powder, the surface of which is coated with the silver containing powder,
wherein the amount of cyanogen in the silver-coated copper powder is in the range of from 3 ppm to 3000 ppm, and
wherein a surface treating agent adheres to the surface of the copper powder coated with the silver containing layer.

24. A silver-coated copper powder as set forth in any one of claims 22 through 23, wherein said silver containing layer is a layer of silver.

25. A silver-coated copper powder as set forth in claim 24, wherein the content of cyanogen in said silver-coated copper powder is in the range of from 3 ppm to 10 ppm.

26. A silver-coated copper powder comprising:
a silver coating layer; and
a copper powder, the surface of which is coated with the silver containing powder,
wherein the amount of cyanogen in the silver-coated copper powder is in the range of from 3 ppm to 3000 ppm, and
wherein the content of each of carbon and nitrogen in said silver-coated copper powder is not less than 0.04% by weight.

27. A silver-coated copper powder as set forth in any one of claims 22 through 23, wherein said silver containing layer is a layer of silver or a silver compound.

28. A silver-coated copper powder as set forth in claim 23, wherein said surface treating agent is phytic acid or an azole.

* * * * *